US008872513B2

(12) United States Patent
Kim et al.

(10) Patent No.: US 8,872,513 B2
(45) Date of Patent: Oct. 28, 2014

(54) MEDIUM DISCRIMINATION APPARATUS AND DISCRIMINATION METHOD THEREOF

(75) Inventors: In-Uk Kim, Anyang-si (KR); Seoung-Oh Han, Seoul-si (KR)

(73) Assignee: LG CNS Co., Ltd., Seoul (KR)

( * ) Notice: Subject to any disclaimer, the term of this patent is extended or adjusted under 35 U.S.C. 154(b) by 552 days.

(21) Appl. No.: 12/999,097

(22) PCT Filed: Jun. 24, 2009

(86) PCT No.: PCT/KR2009/003410
§ 371 (c)(1), (2), (4) Date: Dec. 15, 2010

(87) PCT Pub. No.: WO2009/157716
PCT Pub. Date: Dec. 30, 2009

(65) Prior Publication Data

US 2011/0089939 A1 Apr. 21, 2011

(30) Foreign Application Priority Data

Jun. 25, 2008 (KR) ........................ 10-2008-0060462
Jul. 28, 2008 (KR) ........................ 10-2008-0073713

(51) Int. Cl.
*G01R 33/02* (2006.01)
*G07D 7/04* (2006.01)

(52) U.S. Cl.
CPC ........................................ *G07D 7/04* (2013.01)
USPC ............................ 324/244; 324/228; 324/260

(58) Field of Classification Search
USPC .......................................... 324/244, 228, 260
See application file for complete search history.

(56) References Cited

U.S. PATENT DOCUMENTS

| | | | |
|---|---|---|---|
| 7,377,425 | B1 | 5/2008 | Ma et al. |
| 2003/0098808 | A1 | 5/2003 | Hirai |
| 2006/0102721 | A1 | 5/2006 | Goetz |

FOREIGN PATENT DOCUMENTS

| | | |
|---|---|---|
| CN | 1509458 | 6/2004 |
| JP | 2002-296332 | 10/2002 |
| JP | 2002296332 | 10/2002 |
| JP | 2004-199459 | 7/2004 |
| JP | 2002-296332 | * 10/2009 |
| KR | 1996-0035356 | 10/1996 |

(Continued)

OTHER PUBLICATIONS

Chinese Office Action for 200980124640.0 dated Aug. 27, 2012, citing the above reference(s).

(Continued)

*Primary Examiner* — Reena Aurora
(74) *Attorney, Agent, or Firm* — Lowe Hauptman & Ham, LLP

(57) ABSTRACT

Disclosed are a medium discrimination apparatus and a discrimination method thereof. The medium discrimination apparatus comprises first and second magnetic sensor, a differential analog/digital converter and a controller. The first magnetic sensor senses a magnetic component printed at a specific position of an introduced medium and having a form of an analog signal containing a first noise generated from an internal circuit and a second noise generated from an operation of an actuator. The second magnetic sensor senses the first and second noises which are caused when the medium is transferred and has a form of an analog signal. The differential analog/digital converter performs a subtraction operation for the first and second noises sensed by the first and second magnetic sensors and convert result signals into one digital signal. The controller determines if the introduced medium is genuine or counterfeit according to the digital signal.

10 Claims, 11 Drawing Sheets

(56) References Cited

FOREIGN PATENT DOCUMENTS

| | | |
|---|---|---|
| KR | 10-2003-0033579 | 5/2003 |
| KR | 10-0472164 | 5/2003 |
| KR | 10-2006-0033945 | 4/2006 |
| KR | 10-0607696 | 4/2006 |

OTHER PUBLICATIONS

International Search Report for International application No. PCT/KR2009/003410, citing the attached references.
Supplementary European Search Report for 09770388 dated Oct. 25, 2011, citing the above reference(s).

* cited by examiner

FIG. 6

| position value of magnetic component (E) | intensity value of magnetic component (F) |
|---|---|
| ⋮ | ⋮ |
| 49 | 52 |
| 50 | 30 |
| 51 | −8 |
| 52 | −52 |
| 53 | −80 |
| 54 | −60 |
| 55 | −40 |
| ⋮ | ⋮ |

FIG. 11

| position value of paper money(mm) | intensity values of signals detected by 1st magnetic sensor | intensity values of signals detected by 2nd magnetic sensor |
|---|---|---|
| ⋮ | ⋮ | ⋮ |
| 49 | 52 | 0 |
| 50 | 30 | 0 |
| 51 | -8 | -6 |
| 52 | -52 | -23 |
| 53 | -80 | -72 |
| 54 | -60 | -50 |
| 55 | -40 | -12 |
| 56 | -13 | 10 |
| ⋮ | ⋮ | ⋮ |

MEDIUM DISCRIMINATION APPARATUS AND DISCRIMINATION METHOD THEREOF

CROSS REFERENCE TO RELATED APPLICATION

This application claims the priority of Korean Patent Application No. 10-2008-0060462 filed on Jun. 25, 2008 and Korean Patent Application No. 10-2008-0073713 filed on Jul. 28, 2008, in the KIPO (Korean Intellectual Property Office), the disclosure of which is incorporated herein in their entirety by reference. Further, this application is the National Phase application of International Application No. PCT/KR2009/003410, filed Jun. 24, 2009, which designates the United States and was published in English. Each of these applications is hereby incorporated by reference in their entirety into the present application.

TECHNICAL FIELD

The invention relates to a medium discrimination apparatus, and more particularly to a medium discrimination apparatus and a discrimination method thereof, capable of minimizing noise to improve medium discriminating capability.

BACKGROUND ART

In the present specification, the term of media represents, for example, paper moneys, checks, tickets, and certificates. The media have a thinner thickness than a width or a length thereof, and exist in various forms. In the present specification, the paper moneys will be described as an example of the media.

In general, a paper money discrimination apparatus is applied to an automatic teller machine, a medium handler, or an automatic vending machine to recognize a magnetic component, images, watermarks, fluorescent inks, and a variety of figures and characters printed on a paper money and to find out the type of the paper money and discriminate if the paper money is genuine or counterfeit.

FIG. 1 is a sectional view partially showing the paper money discrimination apparatus to read a magnetic component printed on the paper money.

Referring to FIG. 1, first and second magnetic sensors 12*a* and 12*b* are arranged in line with each other in an upper bracket 10 while being spaced apart from each other at a predetermined distance, thereby detecting a magnetic component printed on a paper money 30. In this case, sensing surfaces of the first and second magnetic sensors 12*a* and 12*b* are directed downward such that the sensing surfaces are exposed, and provided perpendicularly to a transfer direction of the paper money 30. Accordingly, the magnetic component printed on the paper money 30 is detected.

In this case, sensing surfaces of the first and second magnetic sensors 12*a* and 12*b* are directed downward to be exposed, and provided perpendicularly to a transfer direction of the paper money 30 so that the magnetic component printed on the paper money 30 can be detected.

The first and second magnetic sensors 12*a* and 12*b* are magnetoresistance sensors, that is, magnetic pattern recognition sensors.

Upper paper money feeding rollers 14*a* and 14*b* are provided in line with the first and second magnetic sensors 12*a* and 12*b*, and driven corresponding to lower paper money feeding rollers 24*a* and 24*b* to transfer the introduced paper money 30.

The lower paper money feeding rollers 24*a* and 24*b* to transfer the paper money 30 according to the rotation of a paper money feeding roller shaft 20, and sensor contact rollers 26*a* and 26*b* to make a magnetic component printed on the paper money 30 be more exactly detected by lifting the paper money 30, which is moving, to the first and second magnetic sensors 12*a* and 12*b*, so that the paper money 30 approximates the first and second magnetic sensors 12*a* and 12*b*, are provided in a lower bracket 20.

The rollers 24*a*, 24*b*, 26*a*, and 26*b* are arranged at a predetermined interval along the paper money feeding roller shaft 22 in such a manner that the lower paper money feeding rollers 24*a* and 24*b* face the upper paper money feeding rollers 14*a* and 14*b*, and the sensor contact rollers 26*a* and 26*b* face the first and second magnetic sensors 12*a* and 12*b*.

Lower support springs 28*a* and 28*b* are provided at both ends of the paper money feeding roller shaft 22 to continuously push upward the paper money feeding roller shaft 22. Accordingly, spaces between the rollers 24*a*, 24*b*, 26*a*, and 26*b* and to the upper paper money feeding rollers 14*a* and 14*b* and the first and second magnetic sensors 12*a* and 12*b* respectively facing the rollers 24*a*, 24*b*, 26*a*, and 26*b* can be maintained closely. In this case, bearers 29*a* and 29*b* are provided to prevent the rollers 24*a*, 24*b*, 26*a*, and 26*b* from being excessively close to the upper paper money feeding rollers 14*a* and 14*b* and the first and second magnetic sensors 12*a* and 12*b* respectively due to the elasticity of the lower support springs 28*a* and 28*b*.

Meanwhile, although not shown, the paper money discrimination apparatus comprises Amp & Band-pass Filters, which receive sensed analog signals for the magnetic component from the first and second magnetic sensors 12*a* and 12*b*, respectively, amplify the analog signals to signals having stable intensities, and filter noises amplified together with the amplification of the analog signals, an AD (Analog to Digital) converter, which coverts the two filtered analog signals into digital signals, and an MCU (Micro-Controller Unit) which reads the two converted digital signals to discriminate if the introduced paper money 30 is genuine or counterfeit.

In the paper money discrimination apparatus having the above structure, a paper money can be in closely contact with magnetic sensors by a roller that is elastically supported, so that the performance to discriminate between paper moneys can be improved.

The magnetic component detected by the first and second magnetic sensors 12*a* and 12*b* contains a noise component. The noise component is generated because the first and second magnetic sensors 12*a* and 12*b* are affected by a magnetic field generated due to the operation of an actuator (e.g., a motor or a solenoid) provided in the vicinity of the first and second magnetic sensors 12*a* and 12*b*. In addition, the noise component is generated because switching noise of an internal circuit (i.e., a power circuit) is introduced into the first and second magnetic sensors 12*a* and 12*b*.

FIG. 2 shows a graph representing the output of two digital signals from the AD converter. An X axis of the graph represents a position value of a magnetic component and a Y axis of the graph represents an intensity value of the magnetic component.

As shown in FIG. 2, the digital signals converted by the AD converter contain both of a magnetic component A of the introduced paper money 30 and a magnetic component (i.e., noise; B) introduced from the internal circuit or the outside. The magnetic component A of the paper money 30 is sensed only by the first magnetic sensor 110*a* (see ⓐ). This is because a magnetic component of each paper money is printed only on a specific position of the paper money. If the paper money 30 is reversely introduced, the magnetic component A printed on the paper money 30 may be sensed by the second magnetic sensor 12*b* (see ⓑ).

However, the paper money discrimination apparatus has the following problems.

Since the noise B has a relatively large magnetic intensity value, when the MCU reads the magnetic component A of the paper money 30 to discriminate if the paper money is genuine or counterfeit, the noise B degrades the ability of the MCU to discriminate if the paper money is genuine or counterfeit.

In addition, since the MCU receives two digital signals (see ⓐ and ⓑ) from the AD converter and performs a predetermined operation with respect to both of the two digital signals, time to discriminate if the paper money is genuine or counterfeit is required as much as that of the operation.

Further, to prevent the noise B from being introduced from the internal circuit or the outside, a high-price magnetic shielding layer and non-magnetic material may be used. In this case, costs are additionally caused by the magnetic shielding layer and the non-magnetic material, so that the maintenance for the paper money discrimination apparatus may be difficult.

DISCLOSURE

Technical Problem

Accordingly, the present invention has been made to solve the above-mentioned problems occurring in the prior art. An object of the present invention is to provide a medium discrimination apparatus and a discrimination method thereof, capable of minimizing noise when a paper money is introduced, thereby improving the paper money discriminating ability.

Another object of the present invention is to reduce the discrimination time for the papery money.

Technical Solution

According to one aspect of the present invention, a medium discrimination apparatus comprises a plurality of magnetic sensors comprising a first magnetic sensor to sense a magnetic component printed on a specific position of an introduced medium and having a form of an analog signal containing a noise, and a second magnetic sensor to sense a noise which is caused when the medium is transferred and has a form of an analog signal, a differential analog/digital converter to perform a subtraction operation for the noises sensed by the first and second magnetic sensors and convert result from the subtraction operation into one digital signal, and a controller to discriminate if the introduced medium is genuine or counterfeit according to the converted digital signal.

The medium discrimination apparatus further comprises amplifier/band-pass filter parts corresponding to the magnetic sensors in one-to-one correspondence, amplifying the magnetic component of the analog signals which are sensed by the magnetic sensors, and filtering the noises, and a storage part to store reference values used when genuineness of the medium is discriminated.

The reference value is an intensity value of the magnetic component printed on the specific position of the medium.

Each magnetic sensor is a magnetic pattern recognition sensor.

According to another aspect of the present invention, a medium discrimination method includes introducing a medium, sensing by at least two magnetic sensors a magnetic component, which is printed on a specific position of the introduced medium and has a form of an analog signal containing a noise, and a noise which is caused when the medium is transferred and has a form of an analog signal, subtracting the noises of the analog signals by canceling the noise contained in the magnetic component of the analog signal, converting the subtracted noises of the analog signals into a digital signal, and determining if the introduced medium is genuine or counterfeit based on the digital signal.

The noise has intensity lower than intensity of the magnetic component according to the subtraction operation.

According to another aspect of the present invention, a medium discrimination apparatus comprises a plurality of magnetic sensors to sense a magnetic component printed on a specific position of an introduced medium, a subtraction part to perform a subtraction operation with respect to magnetic component signals sensed by and output from the magnetic sensors, and a medium discrimination part to receive an output signal obtained from the subtraction operation by the subtraction part to discriminate if the medium is genuine or counterfeit.

The magnetic sensors comprise first and second magnetic sensors.

The subtraction part comprises a first interface part to receive a first magnetic component signal sensed by and output from the first magnetic sensor, a second interface part to receive a second magnetic component signal sensed by and output from the second magnetic sensor and, a differential circuit part to perform the subtraction operation of each other with respect to the first and second magnetic component signals.

According to still another aspect of the present invention, a medium discrimination apparatus comprises at least one first sensor configured to be in contact with a medium and detecting a magnetic component signal of the medium, a second sensor configured not to be in contact with the medium and detecting a noise signal generated when the medium is transferred, a subtraction/extraction part to perform a subtraction operation with respect to a noise signal contained in the magnetic component signal detected by the first sensor and the noise signal detected by the second sensor to extract the magnetic component signal, an analog/digital converter to convert the extracted signal into a digital signal, and a controller to discriminate if the medium is genuine or counterfeit based on the digital signal.

The medium discrimination apparatus further comprises a plurality of amplifying parts to amplify the detected signals by the first and second sensors. All of the amplifying parts have amplification factors identical to each other.

The first and second sensors are magnetoresistance sensors.

According to still yet another aspect of the present invention, a medium discrimination method comprises detecting a noise signal generated when a medium is transferred and a magnetic component signal printed on the medium, extracting the magnetic component signal by canceling out the noise signal, and determining if the medium is genuine or counterfeit based on the extracted magnetic component signal.

The magnetic component signal contains the noise signal generated when the medium is transferred. The extracting the magnetic component signal extracts the magnetic component signal by performing subtraction operation of the noise signal which is generated when the medium is transferred and the noise signal contained in the magnetic component signal.

The magnetic component signal is detected by a sensor being in contact with the medium, and the noise signal is detected by a sensor not being in contact with the medium.

The medium discrimination method further comprises amplifying the detected signals, and amplifying the extracted magnetic component signal, wherein the detected signals are amplified at amplification factors identical to each other.

Advantageous Effects

As described above, the medium discrimination apparatus and discrimination method thereof according to the present invention have the following effects.

When a paper money is introduced into the medium discrimination apparatus, signals for a magnetic component printed on the paper money are combined into one signal through a subtraction function, so that a noise introduced from an internal circuit or the outside can be minimized. Accordingly, the ability of discriminating between media can be improved, and time taken to discriminate between the media can be reduced.

In addition, low-price material can be used in the medium discrimination apparatus and an external housing thereof instead of metallic material, so that the cost reduction and the maintenance can be easily achieved.

DESCRIPTION OF DRAWINGS

FIG. 6 is a view showing a table representing reference values for the genuine paper money;

FIG. 11 is a view showing a table representing reference values for genuine paper money.

MODE FOR INVENTION

Hereinafter, a medium discrimination apparatus and a control method thereof according to an exemplary embodiment of the present invention will be described in detail with reference to accompanying drawings.

Figure 1:
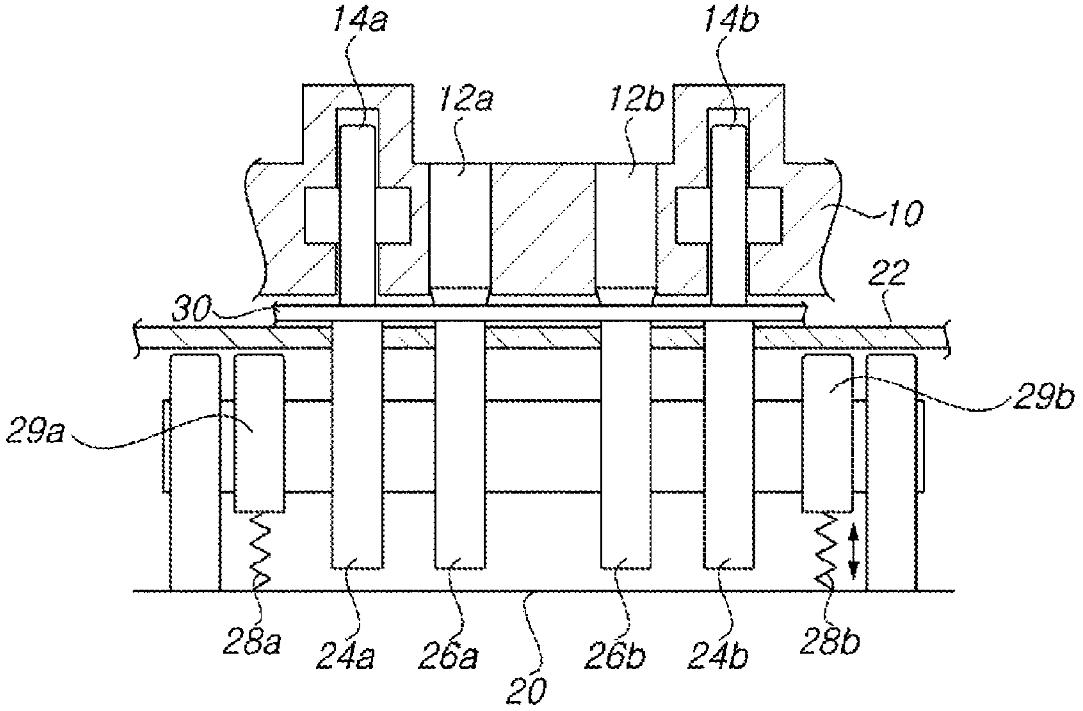
FIG. 1 Prior Art
FIG. 1 is a partial sectional view showing a conventional paper money discrimination apparatus.
Figure 2:
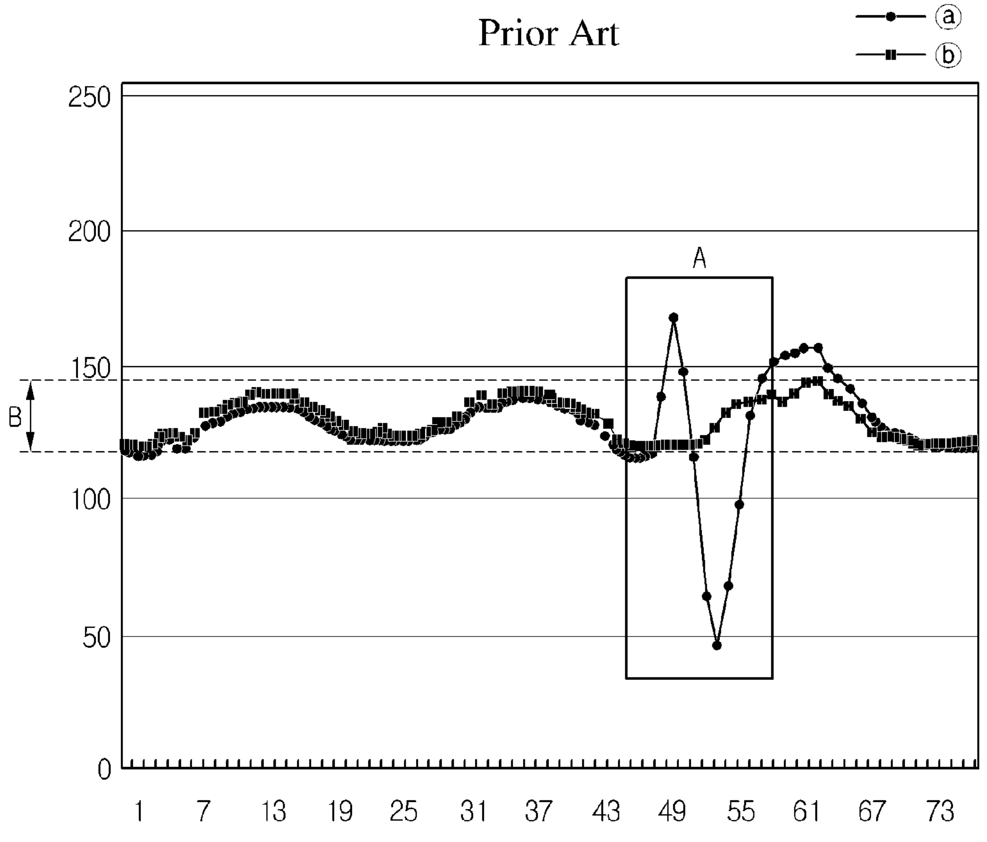
FIG. 2 is an output graph representing digital signals converted by an AD converter of FIG. 1.
Figure 3:
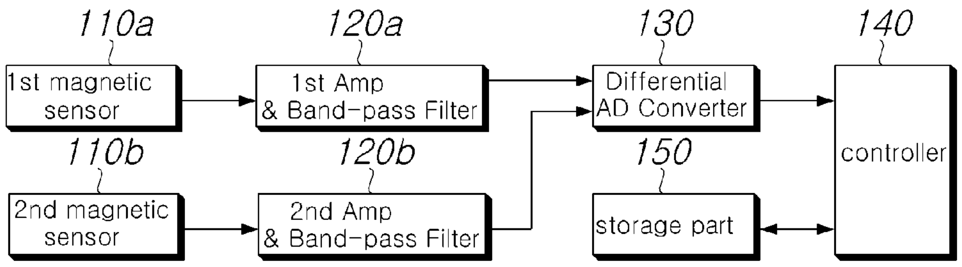
FIG. 3 is a block diagram showing a medium discrimination apparatus according to a first embodiment of the present invention.

FIG. 3 is a block diagram showing a medium discrimination apparatus according to a first embodiment of the present invention. The medium discrimination apparatus according to the present embodiment detects and processes a magnetic component printed on a paper money. Accordingly, only the structure to perform the function will be described below.

Referring to FIG. 3, a paper money discrimination apparatus 100 comprises first and second magnetic sensors 110*a* and 110*b* to sense a magnetic component printed on a specific position of an introduced paper money. As described above, when the magnetic component is printed on the specific position of the introduced paper money, the first magnetic sensor 110*a* senses the magnetic component printed on the specific position of the introduced paper money, and the second magnetic sensor 110*b* senses only a magnetic component (noise) introduced from an internal circuit or the outside instead of the magnetic component of the paper money.

The first and second magnetic sensors 110*a* and 110*b* sense the introduced paper money at a preset interval (e.g., 1 mm or 2 mm) to obtain an analog waveform based on the sensed magnetic component. The preset interval may be decreased or increased if necessary.

The first and second magnetic sensors 12*a* and 12*b* are magnetoresistance sensors, preferably, magnetic pattern recognition sensors. The number of the magnetic sensors is not limited to two. Three or more magnetic sensors may be provided, and installed at the optimal positions according to the printed magnetic component, so that the paper money discrimination ability of the paper money discrimination apparatus 100 can be improved.

As the magnetic component is repeatedly used and time lapses, the intensity of the magnetic component is degraded. Accordingly, first and second Amp & Band-pass Filters 120*a* and 120*b* are provided to amplify the magnetic component and filter noise amplified according to the amplification of the magnetic component.

The first and second magnetic sensors 110*a* and 110*b* correspond to the first and second Amp & Band-pass filters 120*a* and 120*b* in one-to-one correspondence.

A differential analog/digital converter (AD converter) 130 is provided to perform a subtraction operation for the magnetic component filtered by the first and second Amp & Band-pass filters 120*a* and 120*b* and convert the magnetic component performed the subtraction operation into a digital signal. According to the subtraction operation, a magnetic component of an analog signal transmitted from the second Amp & Band-pass filter 120*b* is subtracted from a magnetic component of the analog signal transmitted from the first Amp & Band-pass filter 120*a*. Surely, the magnetic component of the analog signal transmitted from the first Amp & Band-pass filter 120*a* can be subtracted from the magnetic component of the analog signal transmitted from the second Amp & Band-pass filter 120*b*. Accordingly, the two analog signals are combined into one analog signal in which most noise is removed. The AD converter 130 quantizes the combined analog signal into the digital signal.

A controller 140 is provided to receive and read the digital signal. The controller 140 compares one received digital signal with reference values for genuine paper money to discriminate if the paper money is genuine or counterfeit.

A storage part 150 is provided to store the reference values for the genuine paper money such that the controller 140 can discriminate if the introduced paper money is genuine or counterfeit based on the reference values. The reference values comprise a position value of the magnetic component printed on the paper money and the intensity value of the magnetic component corresponding to the position value.

Hereinafter, the medium discrimination method according to the first embodiment of the present invention having the above structure will be described in detail with reference to FIG. 4.

Figure 4:
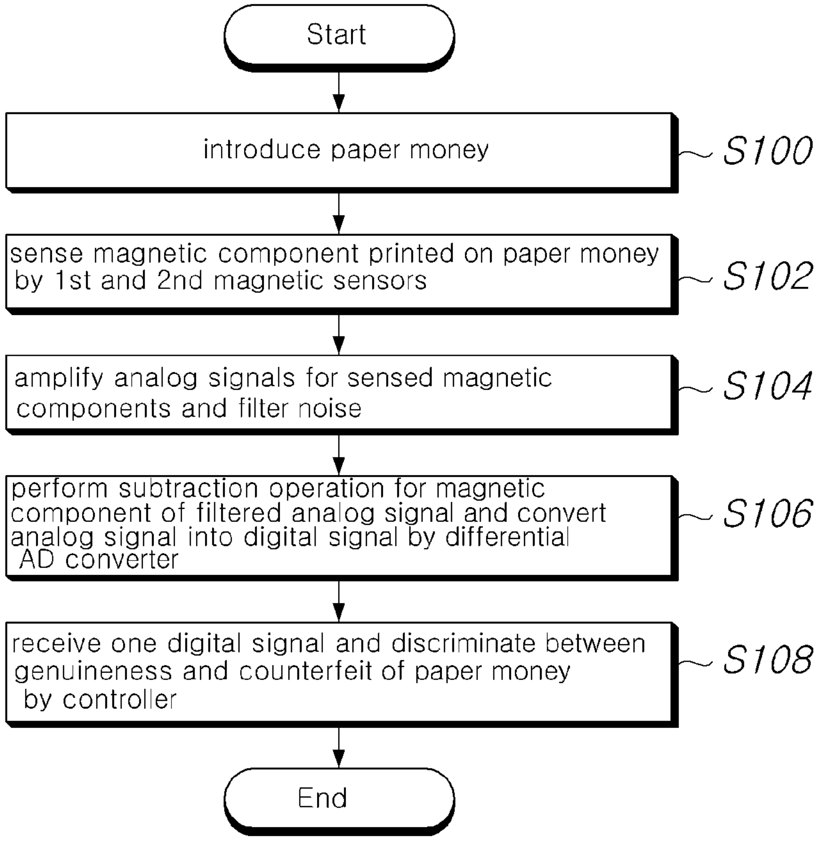
FIG. 4 is a flowchart showing a medium discrimination method according to the first embodiment of the present invention.

Referring to FIG. 4, if a paper money is introduced through a paper money inlet, a sensor (not shown) detects the introduction of the paper money (step S100).

If the introduction of the paper money is detected, the controller 140 transmits a control signal to the first and second magnetic sensors 110*a* and 110*b*.

When the paper money moves, the first and second magnetic sensors 110 and 110*b* sense a magnetic component printed on a specific position of the paper money according to the control signal (step S102). In other words, the first and second magnetic sensors 110*a* and 110*b* sense the magnetic component of the paper money at a preset interval, for example, at an interval of 1 mm.

The first and second magnetic sensors 110*a* and 110*b* transmit the magnetic component sensed at the preset interval in the form of an analog signal to the first and second Amp & Band-pass Filters 120*a* and 120*b* respectively.

In step S104, the first and second Amp & Band-pass Filters 120*a* and 120*b* amplify each analog signal into an analog signal having great power and filter a noise amplified with the analog signal (step S104). The first and second Amp & Band-pass Filters 120*a* and 120*b* transmit the amplified analog signals to the differential AD converter 130.

The differential AD converter 130 receives two filtered analog signals to perform a subtraction operation with respect to the two filtered analog signals. In other words, the differential AD converter 130 subtracts a magnetic component of an analog signal transmitted from the second Amp & Band-pass filter 120*b* from a magnetic component of an analog signal transmitted from the first Amp & Band-pass filter 120*a*. Accordingly, the two analog signals are combined into one analog signal in which most noise is removed.

Figure 5:
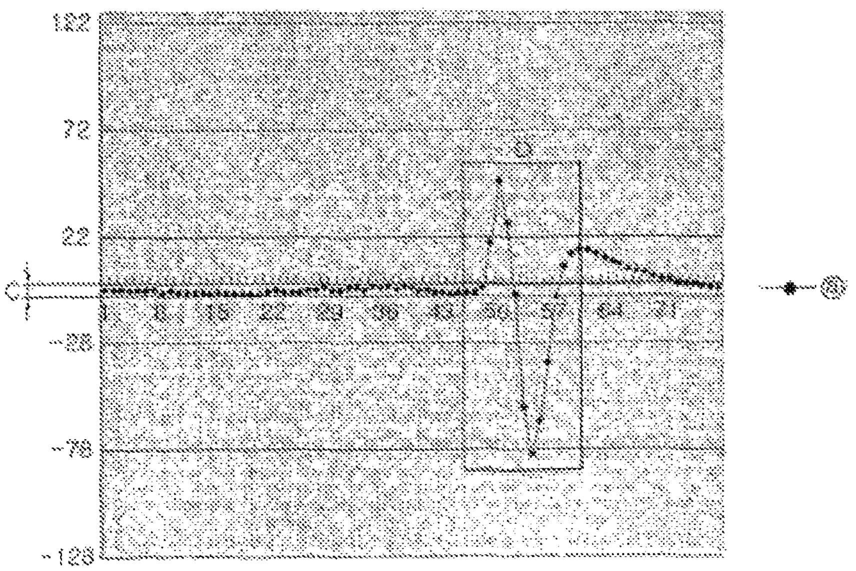
FIG. 5 is an output graph representing digital signals converted by a differential AD converter.

Then, the differential AD converter 130 quantizes the combined analog signal to a digital signal and transmits the digital signal to the controller 140 (step S106). For example, In FIG. 5, an output graph representing the converted digital signal is shown. An X axis of the graph represents a position value of a magnetic component and a Y axis of the graph represents an intensity value of the magnetic component. Referring to FIG. 5, in the converted digital signal (see ⓒ), most noise is removed according to the subtraction operation, and only noise C having a small magnetic intensity value exists. Surely, the intensity value of a magnetic component D printed on the paper money may be partially removed through the subtraction function. However, the removed intensity value is very small. Accordingly, the magnetic component D printed on the paper money is relatively increased as compared with the noise C.

Therefore, the controller 140 receives the digital signal and accesses the storage part 150 to read and discriminate the digital signal (step S108). In other words, the controller 140 compares the magnetic component of the paper money contained in the digital signal with the reference values for the genuine paper money stored in the storage part 150 to discriminate if the introduced paper money is genuine. Such a determination can be achieved by determining if a magnetic intensity value at a position, where the magnetic component printed on the paper money is sensed, is identical to the reference values for the genuine paper money. For example, the table showing the reference values of the genuine paper money is illustrated in FIG. 6. As shown in FIG. 6, the reference values for the genuine paper money comprise magnetic component position values E represented in a unit of 1 mm with respect to the total length of the paper money (e.g., a shorter side of a 10000-won paper money has a length of 68 mm) and magnetic component intensity values F corresponding to the magnetic component position values E ("A" of FIG. 5) in the range of about 49 mm to about 60 mm. Although the reference values for genuine paper money have been described with respect to one kind of paper money for the purpose of explanation, the storage part 150 may store reference values for all kinds of paper moneys and all introduction postures of the paper moneys (e.g., the papery money may be introduced from the front or rear of the paper money and may be introduced in a normal state or a turn-over state). Therefore, for example, if the magnetic component intensity value of about 30 is detected at the magnetic component position value of about 50 mm, the paper money is regarded as genuine. In contrast, if the magnetic component intensity value of about −50 is detected at the magnetic component position value of about 54 mm, the paper money is regarded as counterfeit. Meanwhile, when the genuineness or counterfeit of the paper money is discriminated, the detected magnetic component intensity value is regarded as identical to the reference value, if the detected magnetic component intensity value is in the range of a predetermined allowance by taking into consideration the damage of the paper money and the damage of the magnetic component at the specific position.

As described above, since the controller 140 performs an operation for only one digital signal received therein from the AD converter 130 to discriminate if the paper money is genuine or counterfeit, the time taken to discriminate between the genuineness and counterfeit of the paper money can be reduced.

Figure 7:
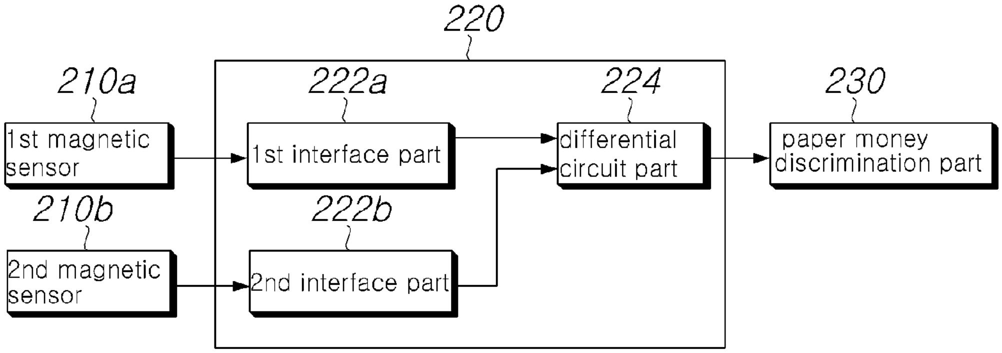
FIG. 7 is a block diagram showing a medium discrimination apparatus according to a second embodiment of the present invention.

Meanwhile, FIG. 7 is a block diagram showing a medium discrimination apparatus according to a second embodiment of the present invention.

Referring to FIG. 7, a medium discrimination apparatus 200 comprises first and second magnetic sensors 21*a* and 21*b* to sense a magnetic component printed on a specific position of a paper money that is introduced. If the magnetic component is printed only on a specific position of the introduced paper money, the first magnetic sensor 210*a* senses the magnetic component on the specific position of the introduced paper money, and the second magnetic sensor 210*b* senses a magnetic component (i.e., noise) introduced from an internal circuit and the outside instead of the magnetic component printed on the specific position of the paper money.

The number of the magnetic sensors is not limited to two. Three magnetic sensors may be provided, and installed at the optimal positions according to the printed magnetic component, thereby more improving the paper money discriminating ability of the paper money by the paper money discrimination apparatus.

A subtraction part 220 is provided to receive signals for the sensed magnetic components and perform a subtraction operation for the signals. The subtraction part 220 comprises a first interface part 210*a* to receive a first magnetic component signal sensed by the first magnetic sensor 210*a*, a second interface part 222*b* to receive a second magnetic component signal sensed by the second magnetic sensor 210*b*, and a differential circuit part 224 to perform the subtraction operation for the first and second magnetic component signals.

A paper money discrimination part 230 is provided to receive an output signal resulting from being performed the subtraction operation by the differential circuit part 224 and discriminate if the introduced paper money is genuine or counterfeit by using the output signal.

Hereinafter, the operating procedure of the medium discrimination apparatus having the above structure will be described.

When the paper money is introduced through a paper money inlet and transferred into the paper money discrimination apparatus 200, the first and second magnetic sensors 210*a* and 210*b* sense the magnetic component printed on the specific position of the paper money. In other words, the first and second magnetic sensors 210*a* and 210*b* sense the magnetic component of the paper money at a preset interval (e.g., about 1 mm).

After the first and second magnetic component signals sensed by the first and second magnetic sensors 210*a* and 210*b* are transferred to the differential circuit part 224 through the first and second interface parts 222*a* and 222*b*, the differential circuit part 224 perform a subtraction operation with respect to the first and second magnetic component signals.

Then, the paper money discrimination part 230 receives the output signal resulting from being performed the subtraction operation by the differential circuit part 224 and discriminates if the paper money is genuine or counterfeit.

As described above, according to the embodiment of the present invention, when determining if the paper money is genuine or counterfeit, the subtraction function is used to minimize noise, so that the ability of discriminating between media can be improved. Accordingly, time taken to discriminate between the genuineness and counterfeit of the paper money can be reduced.

Figure 8:
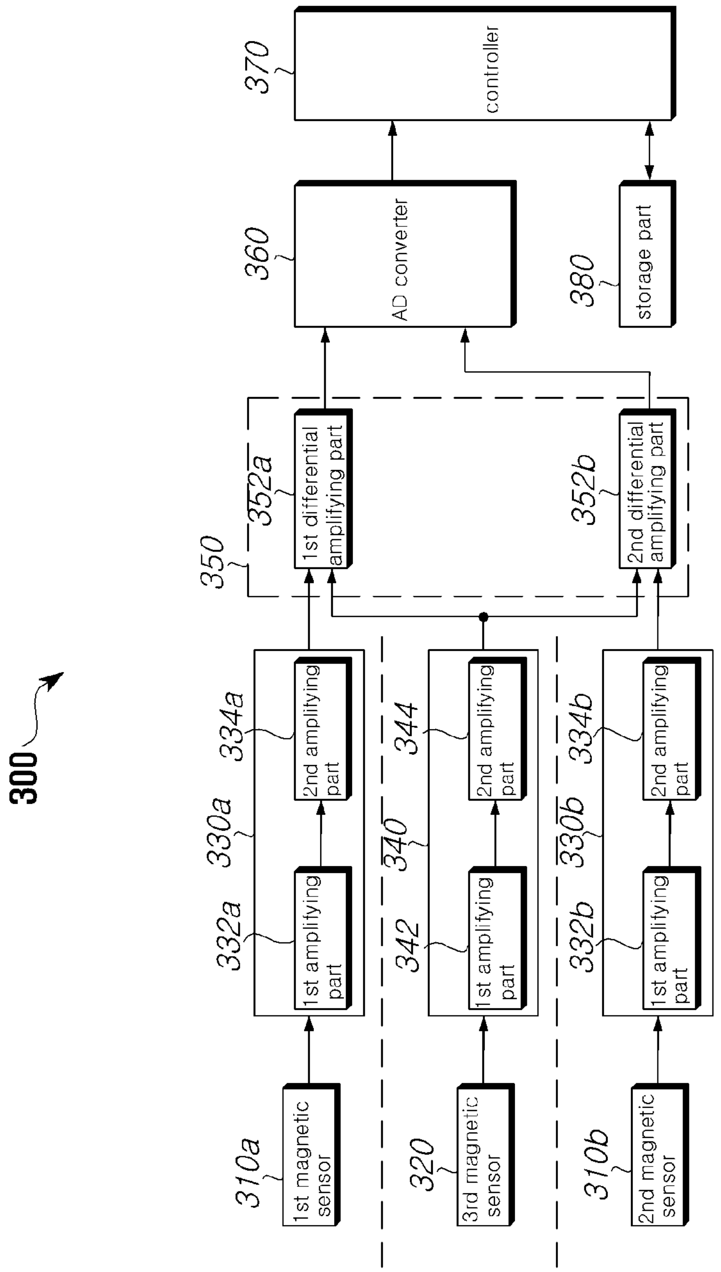
FIG. 8 is a block diagram showing a medium discrimination apparatus according to a third embodiment of the present invention.

FIG. 8 is a block diagram showing a medium discrimination apparatus according to the third embodiment of the present invention. The medium discrimination apparatus according to the third embodiment detects and processes a magnetic component of a paper money. Accordingly, only the structure will be described below.

Referring to FIG. 8, a paper money discrimination apparatus 300 comprises first and second magnetic sensors 310*a* and 310*b* configured to be in contact with an introduced paper money and detect a magnetic component printed on the paper money. The magnetic component contains general noise. The noise comprises electrical noise generated from various internal circuits of the paper money discrimination apparatus 300 and mechanical noise caused by a magnetic field generated when driving units such as a motor/solenoid are driven. Hereinafter, various noises contained in the magnetic component detected by the first and second magnetic sensors 310*a* and 310*b* is referred to as first noise.

To reduce the first noise, a third magnetic sensor 320 is provided to detect noise having the same component as that of the first noise. Hereinafter, noise detected by the third magnetic sensor 320 is referred to as second noise. The third magnetic sensor 320 is placed at a position not to be in contact with the introduced paper money. Therefore, the third magnetic sensor 320 detects only the second noise and does not detect the magnetic component printed on the paper money.

All of the first to third magnetic sensors 310*a*, 310*b*, and 320 are magnetoresistance sensors having a resistance component varying according to the magnetic component.

First to third amplifying circuit parts 330*a*, 330*b*, and 340 are provided to amplify signals detected by the first to third magnetic sensors 310*a*, 310*b*, and 320 to predetermined levels. The first to third amplifying circuit parts 330*a*, 330*b*, and 340 have the same amplification factor. The first amplifying circuit part 330*a* comprises first and second amplifying parts 332*a* and 334*a*. The second amplifying circuit part 330*b* comprises first and second amplifying parts 332*b* and 334*b*. The third amplifying circuit part 340 comprises first and second amplifying parts 342 and 344. The structure is because the magnetic component of the paper money may be degraded due to the repeated and long use of the paper money. Therefore, preferably, the first to third amplifying circuit parts 330*a*, 330*b*, and 340 must have the amplification factor enough to extract the magnetic component. If the first to third magnetic sensors 310*a*, 310*b*, and 320 sufficiently extract the magnetic component from the sensed signals, the first to third amplifying circuit parts 330*a*, 330*b*, and 340 may not be required.

A differential amplifying circuit part 350 is provided to subtract the first and second noise from signals amplified by the first to third amplifying circuit parts 330*a*, 330*b*, and 340 and amplify result signals so that only the magnetic component detected by the fist and second magnetic sensors 310*a* and 310*b* can be extracted. The differential amplifying circuit part 350 comprises a first differential amplifying part 352*a*, which performs the subtraction operation with respect to the signals detected by the first and third magnetic sensors 310*a* and 320 and amplifies result signals, and a second differential amplifying part 352*b* which performs the subtraction operation with respect to signals detected by the second and third magnetic sensors 310*b* and 320 and amplifies result signals.

An analog/digital converter (AD converter) 360 is provided to convert the subtracted/amplified signals into digital signals.

A controller 370 is provided to discriminate if the paper money is genuine or counterfeit based on the converted digital signals.

A storage part 380 is provided to store reference values for a genuine paper money.

Figure 9:
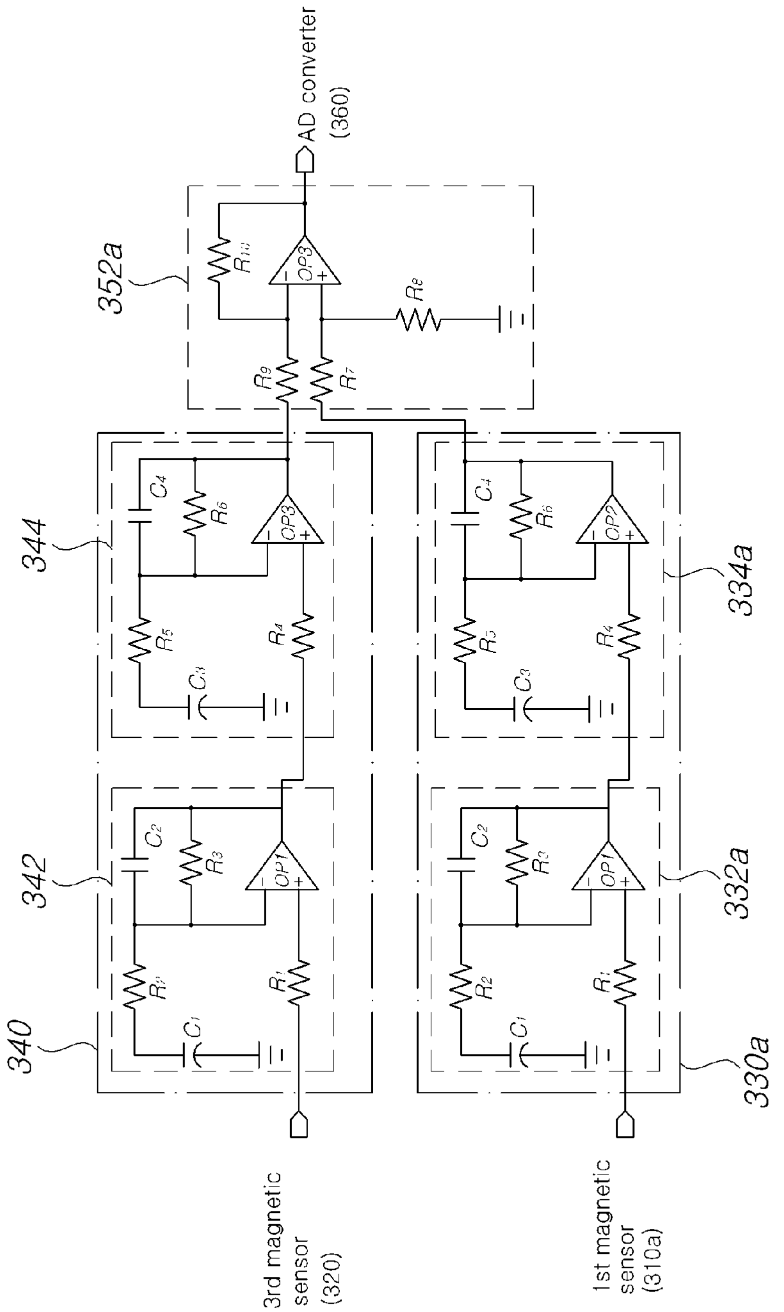
FIG. 9 is a circuit diagram showing an internal circuit of an amplifying circuit and a differential amplifying part.

The internal circuits of the first and third amplifying parts 330*a* and 340 and the first differential amplifying part 352*a* are shown in FIG. 9. Referring to FIG. 9, in the first amplifying part 332*a* of the first amplifying circuit part 330*a*, the first magnetic sensor 310*a* is connected to the non-inverting terminal (+) of a first operational amplifier (OP Amp) OP1 through a resistor R1. In addition, an inverting terminal (−) of the first OP Amp OP1 is connected to a ground terminal. A first capacitor C1 and a resistor R2 are connected to each other in series between the ground terminal and the inverting terminal (−) of the first OP Amp OP1. In addition, a second capacitor C2 and a resistor R3 are connected to each other in parallel between an output terminal of the first OP Amp OP1 and the inverting terminal (−). In the second amplifying part 334*a*, an output terminal of the first OP Amp OP1 is connected to the non-inverting terminal (+) of a second OP Amp OP2 through a resistor R4. An inverting terminal (−) of the second OP Amp OP2 is connected to a ground terminal of the second OP Amp OP2. A third capacitor C3 and a resistor R5 are connected to each other in series between the ground terminal and the inverting terminal (−) of the second OP Amp OP2. A fourth capacitor C4 and a resistor R6 are connected to each other in parallel between the inverting terminal (−) and an output terminal of the second OP Amp OP2. Since the third amplifying circuit part 340 has the same structure as that of the second amplifying circuit part 330*b*, details of the third amplifying circuit part 340 will be omitted in order to avoid redundancy. In the first differential amplifying part 352*a*, the output terminal of the first amplifying circuit part 330*a* is connected to a non-inverting terminal (+) of a third OP Amp OP3 through a resistor R7. A resistor R8 is connected in parallel between the resistor R7 and the non-inverting terminal (+) of the third OP Amp OP3. An output terminal of the third amplifying circuit part 340 is connected to an inverting terminal (−) of the third OP Amp OP3 through a resistor R9. A resistor R10 is connected in parallel between the inverting terminal (−) of the third OP Amp OP3 and the output terminal of the third OP Amp OP3. Through the above structure, the signals detected by the first and second magnetic sensors 310*a* and 320 are amplified to predetermined levels by the first and second amplifying parts 332*a*, 334*a*, 342, and 344.

Then, after the noise component is subtracted by the first differential amplifying part 351*a*, only a magnetic component is output.

Hereinafter, the medium discrimination method according to the third embodiment of the present invention having the above structure will be described in detail with reference to FIG. 10.

Figure 10:
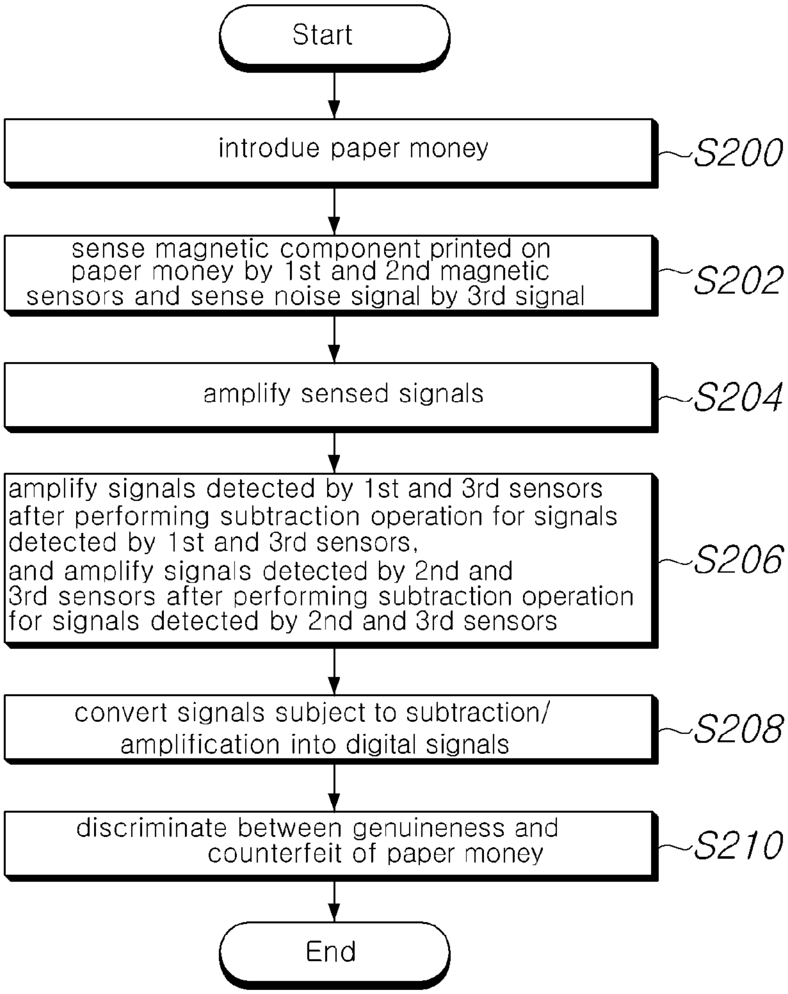
FIG. 10 is a flowchart showing a medium discrimination method according to the third embodiment of the present invention.

Referring to FIG. 10, if a paper money is introduced through the paper money inlet (step S200), the first and second magnetic sensors 310*a* and 310*b* detect a magnetic component of the introduced paper money respectively when the introduced paper money is transferred. The signals detected by the first and second magnetic sensors 310*a* and 310*b* contain a first noise signal. In addition, the third magnetic sensor 320 detects a second noise signal having the same component as that of the first noise signal (step S202).

After the detection has been completed, the first to third amplifying circuit parts 330*a*, 330*b*, and 340 amplify the signals detected by the first to third magnetic sensors 310*a*, 310*b*, and 320 to predetermined levels (step S204).

In step S206, the first differential amplifying part 352*a* subtracts the signals detected by the first and third magnetic sensors 310*a* and 320 from the signals amplified by the first and third amplifying circuit parts 330*a* and 340, and amplifies the result signal so that only the magnetic component detected by the first magnetic sensor 310*a* can be extracted. In other words, after only the magnetic component detected by the first magnetic sensor 310*a* is extracted by canceling out the first noise signal from the second noise signal, the magnetic component is amplified again. Simultaneously, similarly to the first differential amplifying part 330*a*, the second differential amplifying part 352*b* perform a subtraction operation for the signals detected by the second and third magnetic sensors 310*b* and 320 and amplify the signals.

Then, the AD converter 360 converts the signals subtracted/amplified by the first and second differential amplifying parts 352*a* and 352*b*, into digital signals (step S208).

In addition, the controller 370 discriminates if the introduced paper money is genuine or counterfeit based on the converted digital signals (step S210). In other words, the controller 370 reads a magnetic component signal of the paper money contained in the digital signal and compares the magnetic component signal with reference values for genuine paper money stored in the storage part 380, thereby determining if the introduced paper money is genuine or counterfeit. For example, FIG. 11 shows a table representing reference values for the genuine paper money. Referring to FIG. 11, the reference values for the genuine paper money include intensity values of signals, which is detected by the first and second magnetic sensors 310*a* and 310*b*, related to paper money position values representing the total length of a paper money (e.g., the short side of a 10000-won paper money has a length of 68 mm) in a unit of 1 mm.

For example, if an intensity value of signal, which is detected by the first magnetic sensors 310*a*, is 30 and an intensity value of signal, which is detected by the second magnetic sensors 310*b* is 0 at a paper money position value of 50 mm, the paper money is discriminated as genuine. In contrast, if an intensity value of signal, which is detected by the first magnetic sensors 310*a*, is −50 or an intensity value of signal, which is detected by the second magnetic sensors 310*b* is −30 at a paper money position value of 54 mm, the paper money is discriminated as counterfeit. Meanwhile, when the genuineness or counterfeit of the paper money is discriminated, the detected signal intensity value is regarded as identical to the reference value, if the detected magnetic component intensity value is in the range of a predetermined allowance so as to take into consideration the damage of the paper money or the damage of the magnetic component at the specific position. Although the reference values for genuine paper money have been described with respect to one kind of paper money for the purpose of explanation, the storage part 150 may store reference values for all kinds of paper moneys and all introduction postures of the paper moneys (e.g., the papery money may be introduced from the front or rear of the paper money and may be introduced in a normal state or a turn-over state).

Figure 12:
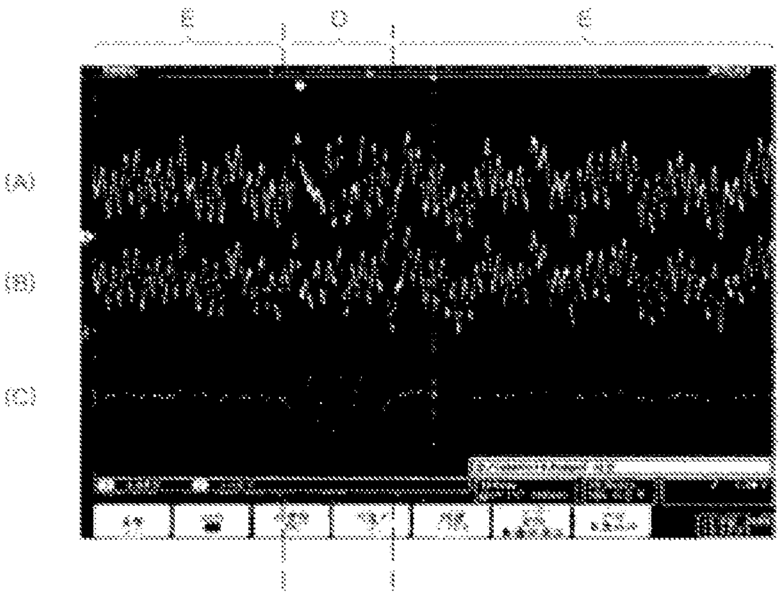
FIG. 12 is a graph representing an output waveform used to explain the process of extracting a magnetic component signal.

FIG. 12 is a graph showing an output waveform used to explain the process of extracting a magnetic component. For the purpose of explanation, only the process of extracting a magnetic component, which is detected by the first magnetic sensor 310*a*, performed by the first differential amplifying part 352*a* will be described. Referring to FIG. 12, '(A)' represents a signal detected by the first magnetic sensor 310*a*, and '(B)' represents a signal detected by the third magnetic sensor 320. The '(A)' contains both of the detected magnetic component signal and the first noise signal, and the '(B)' contains only the second noise signal. Since both of the '(A)' and '(B)' include a noise signal, '(A)' has a signal waveform similar to that of the '(B)'. However, in a region 'D', the '(A)' and '(B)' have a slightly different waveform therebetween. The reason is because the magnetic component signal detected by the first magnetic sensor 310*a* is involved in the region 'D'. Therefore, if '(A)' and '(B)' are subtracted by the first differential amplifying part 352*a*, since only noise signals exist in a region 'E', the noise signals are cancelled out from each other in the region E. Accordingly, only the magnetic component signal '(C)' in which noise signals are cancelled out is extracted in the region 'D'. The magnetic component signal '(C)' is a signal amplified by the first differential amplifying part 352*a*.

As described above, according to the embodiment of the present invention, when determining if the paper money is genuine or counterfeit, various noises introduced into the paper money discrimination apparatus are removed, so that the ability of discriminating between media can be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

In the above embodiments, although two magnetic sensors are provided to detect a magnetic component, at least one magnetic sensor can be provided at the optimal position. In addition, the amplifying circuit parts and the differential amplifying circuit parts are not limited to the structure of accompanying drawings, but may be configured by using other circuit elements.

The invention claimed is:

1. A medium discrimination apparatus comprising:
- a plurality of magnetic sensors including
  - a first magnetic sensor configured
    - to be in contact with an introduced medium to sense a magnetic component printed on a specific position of the introduced medium, and
    - to output a first analog signal corresponding to the sensed magnetic component, the first analog signal containing a first noise generated from an internal circuit and a second noise generated from an operation of an actuator, wherein the first and second noises are caused when the medium is transferred, and a second magnetic sensor configured to not be in contact with the introduced medium to sense the first noise generated from the internal circuit and the second noise generated from the operation of the actuator without sensing the magnetic component of the introduced medium, and to output a second analog signal containing the first and second noises;

a differential analog/digital converter configured to perform a subtraction operation for the first and second analog signals outputted by the first and second magnetic sensors, and to convert a result signal into one digital signal; and a controller configured to discriminate whether the introduced medium is genuine or counterfeit according to the digital signal.

2. The medium discrimination apparatus of claim 1, further comprising:

first and second amplifier/band-pass filter parts corresponding to the first and second magnetic sensors and configured to amplify the first and second analog signals and filter noises; and a storage part configured to store a reference value used when genuineness of the medium is discriminated.

3. The medium discrimination apparatus of claim 2, wherein the reference value is an intensity value of the magnetic component printed on the specific position of the medium.

4. The medium discrimination apparatus of claim 1, wherein each of the first and second magnetic sensors is a magnetic pattern recognition sensor.

5. A medium discrimination method comprising:

introducing a medium;

first sensing, by a first magnetic sensor, a magnetic component, which is printed on a specific position of the introduced medium, said first sensing comprising causing the first magnetic sensor to be in contact with the introduced medium, and to output a first analog signal corresponding to the sensed magnetic component, the first analog signal containing a first noise generated from an internal circuit and a second noise generated from an operation of an actuator, wherein the first and second noises are caused when the medium is transferred;

second sensing, by a second magnetic sensor, the first and second noises without sensing the magnetic component of the introduced medium, said second sensing comprising causing the second magnetic sensor to not be in contact with the introduced medium, and to output a second analog signal containing the first noise generated from the internal circuit and the second noise generated from the operation of the actuator;

subtracting the first and second analog signals to cancel the first and second noises contained in the first and second analog signals;

converting a result signal of said subtracting into a digital signal; and determining whether the introduced medium is genuine or counterfeit based on the digital signal.

6. A medium discrimination apparatus comprising:

a plurality of first magnetic sensors, each of which is configured to be in contact with an introduced medium to sense a magnetic component printed on a specific position of the introduced medium, and to output a first analog signal corresponding to the sensed magnetic component, the first analog signal containing a first noise generated from an internal circuit and a second noise generated from an operation of an actuator, wherein the first and second noises are caused when the medium is transferred;

a second magnetic sensor configured to not be in contact with the introduced medium to sense the first noise generated from the internal circuit and the second noise generated from the operation of the actuator without sensing the magnetic component of the introduced medium, and to output a second analog signal containing the first and second noises;

a subtraction part configured to perform a subtraction operation with respect to the first and second analog signals outputted by the first and second magnetic sensors; and a medium discrimination part configured to receive a subtracted signal from the subtraction part to discriminate whether the introduced medium is genuine or counterfeit.

7. The medium discrimination apparatus of claim 6, wherein the subtraction part includes:

a first interface part configured to receive a first analog signals outputted from the each of the plurality of first magnetic sensors;

a second interface part configured to receive a second analog signal outputted from the second magnetic sensor; and a differential circuit part configured to perform the subtraction operation with respect to the first and second analog signals.

8. A medium discrimination apparatus comprising:

at least one first sensor configured to make contact with a medium and detecting a magnetic component signal of the medium and a noise signal containing a first noise generated from an internal circuit and a second noise generated from an operation of an actuator, wherein the first and second noises are generated when the medium is transferred;

a second sensor configured not to make contact with the medium to detect a noise signal containing the first noise generated from an internal circuit and the second noise generated from the operation of the actuator without detecting the magnetic component of the introduced medium;

a subtraction/extraction part configured to perform a subtraction operation with respect to the noise signal contained in the magnetic component signal detected by the first sensor and the noise signal detected by the second sensor to extract the magnetic component signal;

an analog/digital converter configured to convert the extracted signal into a digital signal; and a controller configured to discriminate whether the medium is genuine or counterfeit based on the digital signal.

9. The medium discrimination apparatus of claim 8, further comprising a plurality of amplifying parts configured to amplify extraction signals of the first and second sensors, wherein all of the amplifying parts have amplification factors identical to each other.

10. The medium discrimination apparatus of claim 8, wherein the first and second sensors are magnetoresistance sensors.

* * * * *